(12) United States Patent
Chou et al.

(10) Patent No.: US 6,500,389 B1
(45) Date of Patent: Dec. 31, 2002

(54) PLASMA ARCING SENSOR

(75) Inventors: Hsiao-Pang Chou, Taipei Hsien (TW); Kuan-Cheng Su, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/561,117

(22) Filed: Apr. 28, 2000

(30) Foreign Application Priority Data

Mar. 2, 2000 (TW) ........................................ 89103702 A

(51) Int. Cl.⁷ ............................................... G01N 30/96
(52) U.S. Cl. ............................. 422/88; 438/48; 438/49
(58) Field of Search ............................ 422/88; 438/48, 438/49, 608, 622, 739

(56) References Cited

U.S. PATENT DOCUMENTS

| | | | | |
|---|---|---|---|---|
| 4,430,191 A | * | 2/1984 | Sone et al. ................. | 204/401 |
| 4,994,159 A | * | 2/1991 | Agarwala et al. ........... | 205/776 |
| 5,342,806 A | * | 8/1994 | Asahina ....................... | 438/608 |
| 5,814,557 A | * | 9/1998 | Venkatraman et al. ...... | 438/622 |
| 6,017,775 A | * | 1/2000 | Igel et al. ..................... | 438/48 |
| 6,028,009 A | * | 2/2000 | Igel et al. .................... | 438/739 |

\* cited by examiner

Primary Examiner—Jill Warden
Assistant Examiner—Brian Sines
(74) Attorney, Agent, or Firm—J. C. Patents

(57) ABSTRACT

A plasma arcing sensor is used to increase the frequency of plasma arcing by way of neutralization of positive charges and negative charges. When the plasma arcing can be predicted, the process parameters to prevent from the plasma arcing can be carried out. The plasma arcing sensor comprises a top conductive layer formed over a substrate. A conductive layer is disposed between the top conductive layer and the wafer where the conductive layer and the top conductive layer are electrically isolated with dielectrics.

9 Claims, 2 Drawing Sheets

PLASMA ARCING SENSOR

CROSS-REFERENCE TO RELATED APPLICATION

This application claims the priority benefit of Taiwan application serial no. 89103702, filed Mar. 2, 2000.

BACKGROUND OF THE INVENTION

1. Field of Invention

The present invention relates to a semiconductor structure. More particularly, the present invention relates to a plasma arcing sensor.

2. Description of Related Art

Since the deposition process by plasma has it characteristic of low temperature operation and the plasma etching is anisotropic etching, the processes with regard to plasma are widely used in fabricating semiconductor integrated circuits. The plasma process is carried out by forming ions or atoms with charges in the plasma chamber and followed by ion bombardment to the wafer. When the ions or atoms in the plasma chamber carry a great amount of charges, and the suspector, used to support the wafer, is biased, arcing happens between the wafer and such carriers. As a result, arcing causes damage of wafer during the fabrication of the semiconductor and leads to failure of product percentage to $\frac{1}{1000}$ high such that the productivity is seriously reduced. Thus, adjusting the conditions and parameters of the process to prevent from arcing is important.

However, it is quite difficult to monitor or study arcing phenomenon since it may not occur often, and normally it may happen once a while and then disappear. Repeatable experiment is nearly impossible since arcing is hard to predict due to its low possibility. Accordingly, when the process engineer changes conditions of the plasma process to reduce the arcing, it cannot be tested by repeated experiment.

SUMMARY OF THE INVENTION

The invention provides a plasma arcing sensor, thereby increasing the possibility of arcing in the plasma chamber.

The invention also provides a plasma arcing sensor to increase the possibility of arcing in the plasma chamber and helps engineers adjust the parameters of the process, thereby preventing from arcing in the plasma chamber.

As embodied and broadly described herein, the invention provides a plasma arcing sensor. A conductive layer is formed over a substrate. A top conductive layer, formed over the conductive layer, is isolated from the conductive layer with dielectrics. An insulating layer is formed to cover the top conductive layer. The area of the top conductive layer is smaller than that of the conductive layer.

The invention further provides a plasma arcing sensor. A plurality of conductive layers is formed over a substrate and such conductive layers are insulated by dielectrics. A top conductive layer, formed over the conductive layers, is covered by an insulating layer and isolated from the conductive layers with dielectrics. The area of the top conductive layer is smaller than that of the conductive layers.

This invention also provides a method of monitoring plasma arcing, thereby detecting the possibility of plasma arcing when an insulating layer is etched by plasma. A wafer having a plurality of plasma arcing sensors is provided, and each of the plasma arcing sensors has a top conductive layer with different charge density thereon. A plasma etching process is performed to the wafer to expose the top conductive layer and then neutralization between the top conductive layer and the plasma decides the possibility of plasma arcing.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Plasma arcing is so hard to predict that plasma arcing cannot be reduced by way of adjusting process parameters with repeated experiments. This embodiment is to design a plasma arcing sensor which raises the frequency of plasma arcing by virtue of principle of neutralization between positive and negative charges. As the arcing happen predictably, the process of adjusting the parameters to prevent from arcing can be performed.

The plasma process is performed by ion bombardment with ions or atoms. In the plasma chamber, not only the atoms or ions but also the wafer due to ion bombardment carry charges. When the polarity of charges within the plasma and that of the carriers on the wafer are opposite, plasma arcing occurs. In addition, when the wafer has conductive material thereon or the surface of the wafer is rough, the possibility of plasma arcing is thus increased to $\frac{1}{1000}$ high.

Therefore, a plasma arcing sensor is fabricated on a wafer in this embodiment. A conductive layer with large area is formed on the wafer. A conductive layer with small area is formed on the conductive layer with large area where the two conductive layers are insulated with dielectrics. When the wafer is biased, the charges aggregate on the surface of the wafer and the surface of the conductive layer with small area also have charges thereon due to electrostatic induction. When the conductive layer with is small area has higher charge density and is exposed in a plasma surroundings, the charges within the plasma is easily neutralized with that on the conductive layer. As a result, artificial plasma arcing is produced.

Figure 1A:
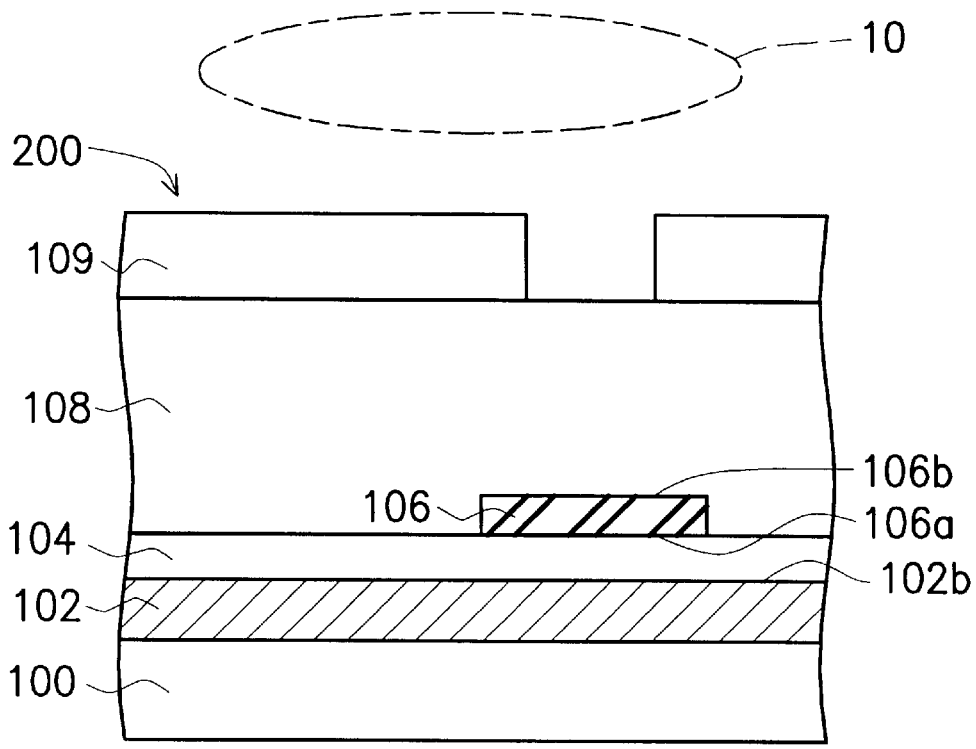
FIGS. 1A–1B are schematic, cross-sectional views illustrating a plasma arcing sensor according to one preferred embodiment of this invention.
Figure 1B:
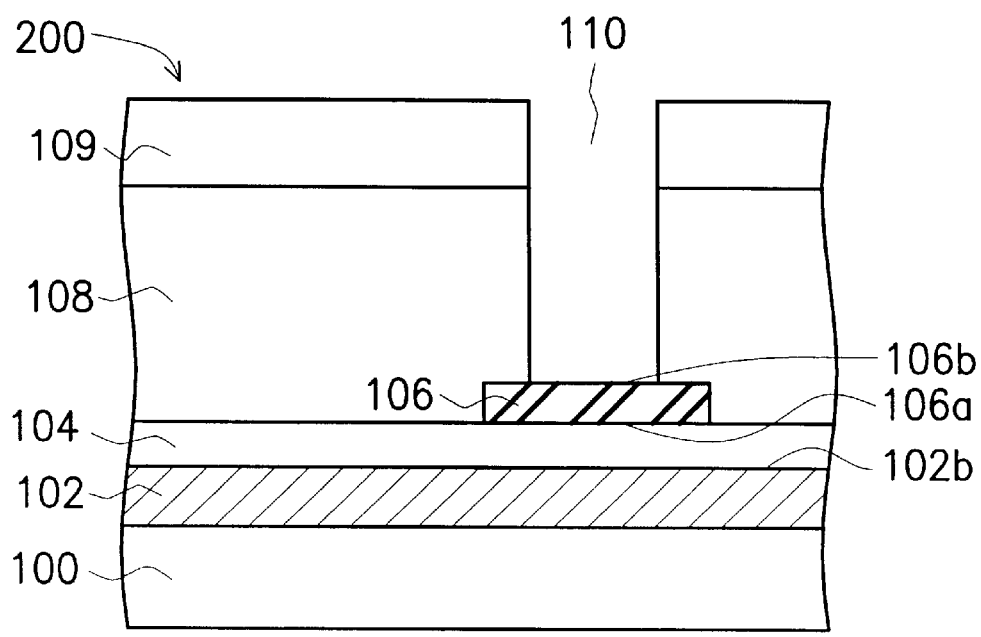

FIGS. 1A–1B are schematic, cross-sectional views illustrating a plasma arcing sensor. As illustrated in FIG. 1A, when a substrate 100 is negatively biased, a top surface 102b of a conductive layer 102 carries negative charges $q_1$, and meanwhile, equal amount of positive charges $q_1$ is produced on a bottom surface 106a of the conductive layer 106 since electrostatic induction. Then, a top surface 106b of the conductive layer 106 is electrostatically inducted with negative charges equal to $q_1$, such that negative charges $q_1$ accumulates on the top surface 106b of the conductive layer 106. Since the area $A_1$ of the conductive layer 102 is far larger than the area $A_2$ of the top conductive layer, the charge density ($q_1/A_2$) of the top surface 106b of the top conductive layer 106 is far larger than the charge density ($q_1/A_1$) of the top surface 102b of the conductive layer 102. Therefore, when the charge density of the top surface 106b of the top conductive layer 102 is sufficiently high, the negative charges thereon are easily neutralized with the positive charges within the plasma 10.

The structure of plasma arcing sensor 200 as shown in FIG. 1A and FIG. 1B is to monitor the arcing possibility when the insulating layer 108 is etched by plasma. Referring to FIG. 1A, a conductive layer 102 is formed over a substrate 100. The conductive layer 102 can be, for example, metal such as aluminum or TiN$_x$, or conductive material such as polysilicon. The conductive layer 102 can completely cover the substrate 100 or be patterned with a wide-range area. Thereafter, a dielectric layer 104 is formed on the conductive layer 102. The dielectric layer 104, including silicon oxide or BPSG, can be formed by chemical vapor deposition, for example, and covers the conductive layer 102. A top conductive layer 106 is formed on the dielectric layer 104 and patterned. The area $A_2$ of the top conductive layer 106 has to be smaller than the area $A_1$ of the conductive layer 102 where the area percentage is in the range of about 1:1–1:100000. An insulating layer 108 is formed to cover the top conductive layer 106. Thereafter, a photoresist layer 109 is coated and patterned. The substrate 100 is retrieved to the plasma chamber and the plasma 10 is utilized to etch the insulating layer 108, such that an opening 110 is formed and the top conductive layer 106 is exposed by the photoresist 109, as shown in FIG. 1B. As the top conductive layer 106 is exposed in the plasma 10, if the charge density of the exposed conductive layer 106 is high enough and has the opposite polarity with that in the plasma 10, the plasma arcing possibility is increased.

Figure 2:
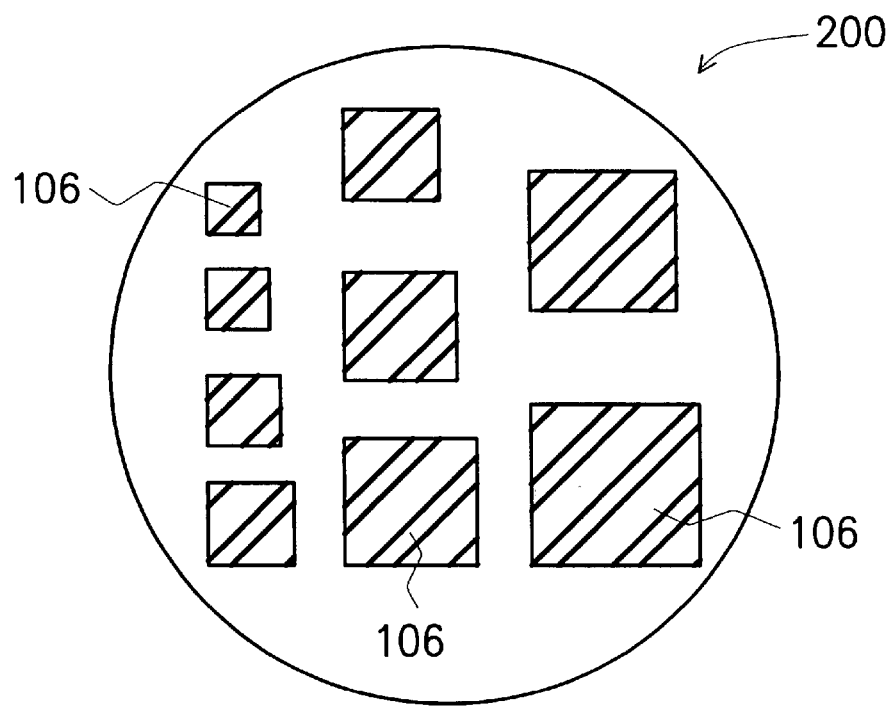
FIG. 2 is a top view of a plasma arcing sensor according to one preferred embodiment of this invention.

Therefore, the structure of the plasma arcing sensor as shown in FIG. 2 can be used to perform a test when the chamber parameters or the reactants is adjusted to reduce plasma arcing during the fabrication of the integrated circuits. The wafer 200 (cross-sectional structure is as shown in FIG. 1A) covered by the insulating layer 108 is retrieved to the plasma chamber and then the process parameters are adjusted to a desired value. When the insulating layer 108 is etched by plasma to expose the top conductive layer 106 (FIG. 2), observing the neutralization of charges between the plasma 10 and the top conductive layer 106, and whether the plasma arcing being reduced due to adjustment of the process parameters can be known. For example, before the process parameters are adjusted, the charges on the top conductive layer 106 on the wafer 200 are all neutralized with the carriers within the plasma. After the process parameters change, only half of the top conductive layer 106 having smaller area than others on the wafer are neutralized. Thus, the plasma arcing is indeed reduced by adjusting the pre-determined process parameters such that the experiment results can be practically carried out in line.

A blanket conductive layer 102 can be formed on the foregoing wafer 200. After the conductive layer 102 being covered by the dielectric layer 104, the top conductive layer 106 is then formed and patterned. A mask to pattern the top conductive layer 106 is designed with different area such that the top conductive layer 200 having varied areas can be formed on the same wafer, as shown in FIG. 2. The area of the top conductive layer 106 can be designed with a pre-determined rule to gradually enlarge the area. The larger the area of the top conductive layer 106 is, the lower the charge density of the surface of the top conductive layer 106 is. Therefore, the possibility that the charges on the top conductive layer 106 neutralizes with the carriers within the plasma is lower. The chance that plasma arcing occurs is higher when the top conductive layer 106 with larger area on the wafer is neutralized. By virtue of such principle, the plasma arcing can be observed.

Figure 3:
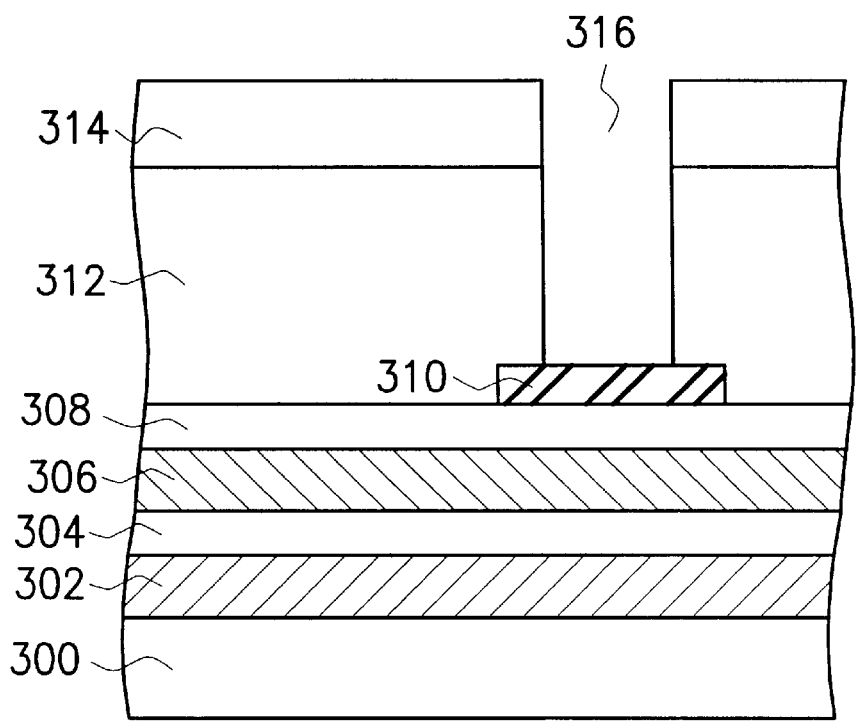
FIG. 3 is a schematic, cross-sectional view illustrating a plasma arcing sensor according to another preferred embodiment of this invention.

FIG. 3 is a schematic, cross-sectional view illustrating a plasma arcing sensor according another preferred embodiment of the invention. A first conductive layer 302, a first dielectric layer 304, a second conductive layer 306 and a second dielectric layer 308 are successively formed over a substrate 300. Thereafter, a patterned top conductive layer 310 is formed on the second dielectric layer 308. An insulating layer 312 defined by a photoresist layer 314 is formed on the top conductive layer 310, and plasma etching is performed to remove a portion of the insulating layer 312 above the top conductive layer 310. Accordingly, an opening 316 is formed to expose the top conductive layer 310.

When the substrate 300 is biased to enable the surface of the first conductive layer 302 to carry negative charges, the surface of the top conductive layer 310 is negative due to electrostatic induction. Thus, the top conductive layer 310, which has smaller surface area but equal charges to the first and the second conductive layer 302, 306, can have larger charge density. In this manner, the negative charges of the top conductive layer 310 can be easily neutralized with the positive charges within the plasma when the etching process is employed to expose the top conductive layer 310.

Simultaneously, the structure of the plasma arcing sensor can be fabricated as the wafer illustrated in FIG. 2. The top conductive layer 310 with different areas having different charge density can monitor the plasma arcing possibility as etching the insulating layer 312 as to expose the top conductive layer 310.

According to the above preferred embodiment, when a plurality of conductive layers 302, 306 are formed between the top conductive layer 312 and the substrate 300, and the conductive layers 302, 306 and the top conductive layer 310 are isolated from dielectrics 304, 308, the plasma arcing sensor can detect the possibility of neutralization between the top conductive layer 310 and the plasma.

The preferred embodiments of the invention are to increase the possibility of arcing by accumulating sufficiently high charge density during etching process. Therefore, plasma arcing can be predicted and reduced by adjusting process parameters.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A plasma arcing sensor for promoting arcing in a plasma chamber, comprising:
   a substrate;
   a conductive layer, disposed on the substrate;
   a dielectric layer, formed on the conductive layer;
   a metal layer, formed on the dielectric layer; and
   an insulating layer, covering the metal layer, wherein the insulating layer has an opening to expose the metal layer, whereby a plasma arcing can be produced under a plasma environment when a charge density on the exposed metal layer is sufficiently high;

wherein a surface area of the exposed metal layer is smaller than a surface area of the conductive layer.

2. The sensor according to claim 1, wherein the conductive layer comprises metal layer.

3. The sensor according to claim 1, wherein the conductive layer comprises polysilicon layer.

4. The sensor according to claim 1, wherein an area ratio between the exposed metal layer and the conductive layer is in the range of 1 to 1/100000.

5. A plasma arcing sensor for promoting arcing in a plasma chamber, comprising:

a substrate;

a plurality of conductive layers, disposed on the substrate and isolated from one another via a plurality of first dielectric layers;

a top conductive layer, disposed over the conductive layers and isolated from the conductive layers via a second dielectric layer; and an insulating layer, covering the top conductive layer, wherein the insulating layer has an opening to expose the top conductive layer, whereby a plasma arcing can be produced under a plasma environment when a charge density on the exposed top conductive layer is sufficiently high;

wherein a surface area of the exposed top conductive layer is smaller than a surface area of the conductive layers.

6. The sensor according to claim 5, wherein the conductive layer comprises metal layer.

7. The sensor according to claim 5, wherein the conductive layer comprises polysilicon layer.

8. The sensor according to claim 5, wherein the top conductive layer comprises metal layer.

9. The sensor according to claim 5, wherein an area ratio between the exposed top conductive layer and the conductive layer is in the range of 1 to 1/100000.

* * * * *